US006607640B2

(12) United States Patent
Sundarrajan et al.

(10) Patent No.: US 6,607,640 B2
(45) Date of Patent: *Aug. 19, 2003

(54) TEMPERATURE CONTROL OF A SUBSTRATE

(75) Inventors: Arvind Sundarrajan, Santa Clara, CA (US); Darryl Angelo, Santa Clara, CA (US); Tse-Yong Yao, San Francisco, CA (US); Peijun Ding, San Jose, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 75 days.

(21) Appl. No.: 09/538,343

(22) Filed: Mar. 29, 2000

(65) Prior Publication Data
US 2001/0025783 A1 Oct. 4, 2001

(51) Int. Cl.$^7$ ................................................ C23C 14/34
(52) U.S. Cl. ................................................ 204/192.15
(58) Field of Search ................................ 427/8; 216/59; 204/192.12, 192.13, 192.15, 298.15

(56) References Cited

U.S. PATENT DOCUMENTS

| 5,178,739 A | * | 1/1993 | Barnes et al. | 204/192.12 |
| 5,266,524 A | * | 11/1993 | Wolters | 437/194 |
| 5,513,594 A | * | 5/1996 | McClanahan et al. | 118/503 |
| 5,830,533 A | * | 11/1998 | Lin et al. | 427/272 |

FOREIGN PATENT DOCUMENTS

EP 533254 * 3/1993 ......... H01L/21/285

* cited by examiner

Primary Examiner—Steven H. Ver Steeg
(74) Attorney, Agent, or Firm—Birgit E. Morris

(57) ABSTRACT

A method of improving the temperature control of a clamped substrate mounted on a substrate support that is biased, the substrate support having a passage therethrough to permit a flow of backside gas for heating or cooling the substrate, whereby the pressure of the backside gas is maintained at at least 15 torr. A high gas pressure improves the thickness uniformity of processing across the substrate. For plasma deposition of sputtered seed layers, the morphology of the seed layer is improved near the edge of the substrate and the uniformity of the layer across the substrate is also improved.

5 Claims, 2 Drawing Sheets

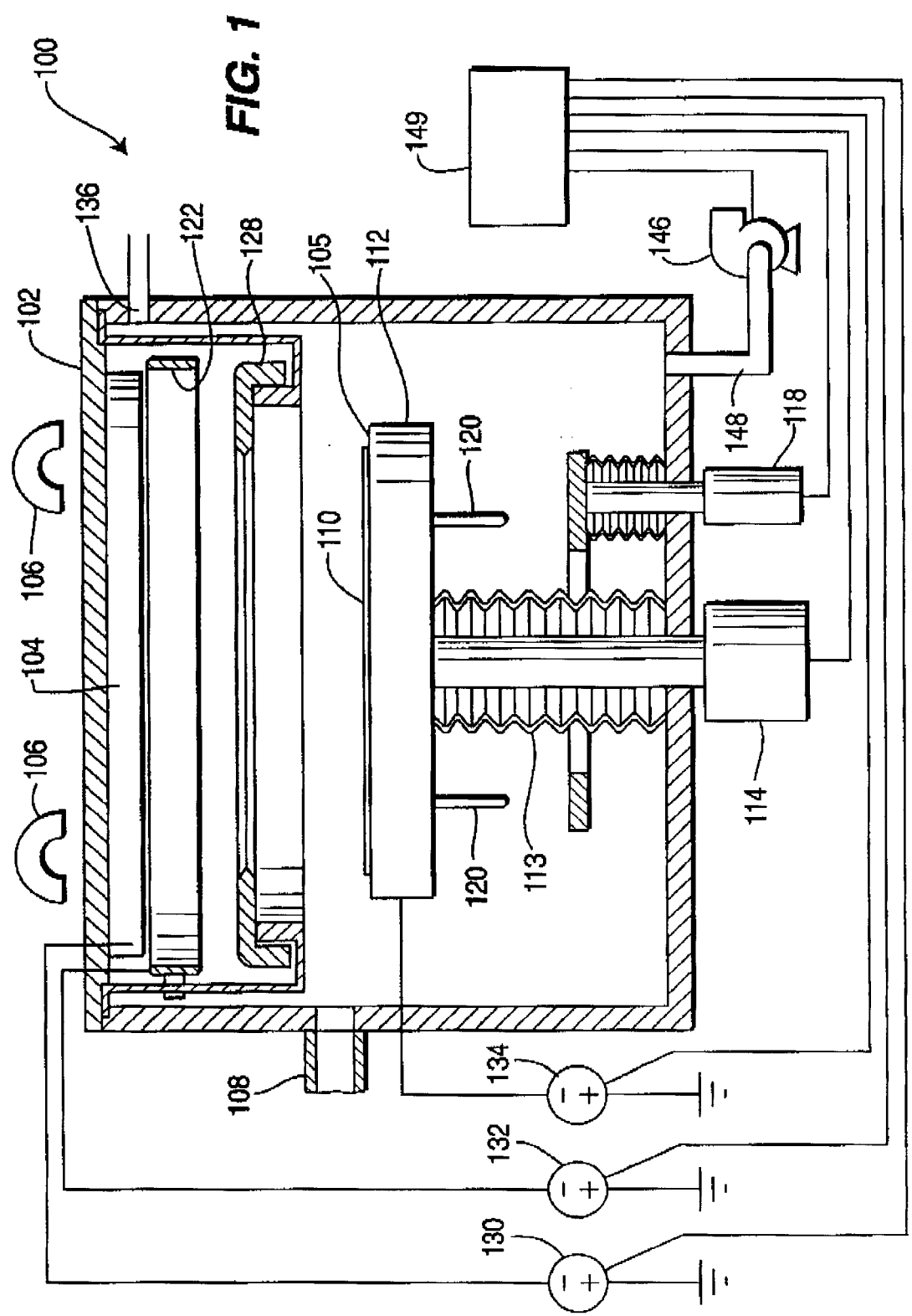

TEMPERATURE CONTROL OF A SUBSTRATE

This invention relates to an improved method of controlling the temperature of a substrate clamped to a substrate support in a deposition chamber.

BACKGROUND OF THE INVENTION

As semiconductor substrates become larger, and devices formed therein become smaller, new materials and processes must be developed for making these devices. For example, the use of aluminum, which has long been used to make conductive paths and contacts, is being supplanted by copper, which is more conductive and thus has a lower resistivity. Further, copper has superior electromigration properties than does aluminum, even, for example, aluminum doped with silicon. Thus copper has some superior properties for integrated circuits.

A problem with using larger substrates, e.g., silicon wafers, is that processing uniformities are more difficult to maintain across the larger wafer; processing must be uniform across the diameter of the wafer in order to produce devices that are the same across the wafer, irrespective of their position on the wafer. As 8 inch diameter wafers are replaced with wafers of approximately 12 inches in diameter (200 mm diameter), this is not a trivial task.

In preparation for the deposition of copper onto a previously deposited and etched dielectric insulative or other layer, conventionally a barrier layer is deposited between the previously deposited film and the copper layer. The barrier layer can be made of Ta, TaN, W, $WN_x$ and the like. A seed layer of copper is then deposited onto the barrier layer by sputter deposition, which is followed by electroplating of copper onto the substrate to a finished thickness.

The morphology of the copper seed layer is very important; if the seed layer is rough or bumpy or non-uniform in thickness across the layer, the overlying electroplated copper layer will also be non-uniform, particularly since the copper layers deposited inside the vias and contact openings may be very thin.

A seed layer of copper can be deposited in a sputter deposition reactor. A suitable sputter deposition reactor has a biasable substrate support electrode that can be cooled or heated with a flow of chilled or heated fluid therethrough. The wafer temperature can be maintained close to that of the support electrode by a flow of backside gas, such as about 15 sccm of argon or other inert gas which is passed between the wafer support and the wafer.

A suitable chamber for depositing a copper seed layer is shown in FIG. 1 in a schematic cross sectional view. This chamber is known as an ionized metal plasma (IMP™) a trademark of Applied Materials, Inc. chamber The IMP™ chamber 100 as shown in FIG. 1 comprises a target 104 comprising the material to be sputtered, i.e., copper or other metal, which is mounted on the lid 102 of the chamber. Magnets 106 are mounted on the lid 102 behind the target 104. A substrate support 112 is movable vertically within the chamber and includes an upper support surface 105 for supporting a substrate 110. The support member 112 is mounted on an elevator 113 connected to a motor 114 that raises and lowers the support 112 between a lowered loading/unloading position and a raised, processing position. An opening 108 in the chamber wall permits entry and egress of the substrate prior to and after processing. A lift motor 118 raises and lowers pins 120 mounted in the substrate support 112, which in turn raise and lower the substrate 110 to and from the upper support surface 105 of the substrate support 112.

A coil 122 provides inductive magnetic fields in the chamber to generate and maintain a higher density plasma between the target 104 and the substrate 110 than would be possible with standard magnetron sputtering of the target 104. The coil 122 is preferably a flat surface facing inward to the chamber and composed of the same material as the target, as it too will be sputtered to provide deposition material to the substrate. A clamp ring 128 is mounted between the coil 122 and the substrate support 112 which shields an outer edge and the backside of the substrate 110 from sputtered material in the chamber when the substrate 110 is raised into a processing position. In the processing position, the substrate support 112 is raised upwardly into the clamp ring 128.

Three power sources are used in the chamber 100. A first power source 130 delivers power to the target 104 to cause the formation of a plasma from a processing gas through gas inlet 136. A second power source 132, preferably an RF power source, supplies power to the coil 122 to increase the density of the plasma. A third power source 134 biases the substrate support 112 and thereby provides directional attraction of the ionized sputtered target material toward the substrate 110. A vacuum pump 146 coupled to an exhaust pipe 148, in combination with an argon supply (including argon passing under the substrate to and into the chamber) maintain the desired pressure in the chamber.

A controller 149 controls the functions of the power supplies, lift motors, vacuum pump and other chamber components and functions.

In operation, a robot delivers a substrate 110 to the chamber 100 through the opening 108. The pins 120 are extended upwardly to lift the substrate 110 from the robot, which is then retracted from the chamber 100. The opening 108 is then sealed. The pins 120 lower the substrate 110 to the upper surface 105 of the substrate support 112. The substrate support 112 is then raised so that the substrate 110 engages the clamp ring 128. One or more plasma gases are introduced into the chamber 100 through gas inlet 136 and a plasma is generated between the target 104 and the substrate support 112 with power from the first power source 130.

The second power source 132 delivers power to the coil 122 to densify the plasma and ionize at least an additional portion of the sputtered target material from the target 104. The substrate support 112 is then biased by the third power source 134, so that the sputtered ionized particles are accelerated towards the substrate 110. A flow of gas is initiated in the substrate support to heat or cool the substrate 110 during deposition. After deposition is complete, the substrate support is lowered to permit retrieval of the processed substrate and to deliver another substrate for processing.

The substrate support 112 also includes a passage for the flow of an inert gas to the surface 105 of the support 112. The gas can be supplied from a single opening in the support 112, or the gas can be led through channels in the support surface 105 (not shown) to permit more uniform heating or cooling of the substrate 110.

However, the chamber 100 produces a non-uniform deposit of a seed layer of copper onto the substrate. The deposited copper seed layer is essentially smooth at the center of the substrate, but is very rough nearer the edges of the substrate. It was believed that this non-uniformity was caused by heating of the clamp ring 128 over time (to 300–400° C.). However, the rough deposits extend up to 2.5 inches from the edge of the substrate, far more than the width that the clamp ring rests on the substrate. Thus the temperature of the clamp ring does not explain the problem or suggest a solution.

A method for improving the uniformity of a deposited copper seed layer across a substrate would be highly desirable.

SUMMARY OF THE INVENTION

We have found that by maintaining a minimum pressure of the temperature control gas between the substrate support and the substrate of at least 15 torr, improved uniformity of the thickness and morphology of a sputter deposited layer metal seed can be achieved.

BRIEF DESCRIPTION OF THE DRAWING

FIG. 1 is a schematic cross sectional view of an ionized metal plasma chamber suitable for use in the invention.

DETAILED DESCRIPTION OF THE INVENTION

A minimum pressure of the temperature control gas must be maintained between the substrate support and the clamped substrate in order to sputter deposit a thin (seed) uniform metal layer across the diameter of a substrate.

Figure 2A:
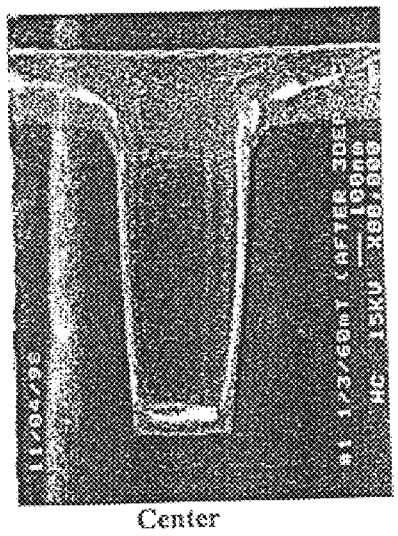
FIGS. 2A and 2B are photomicrographs of a deposited copper seed layer taken at the center (2A) and periphery (2B) of a substrate deposited in accordance with a prior art process.
Figure 2B:
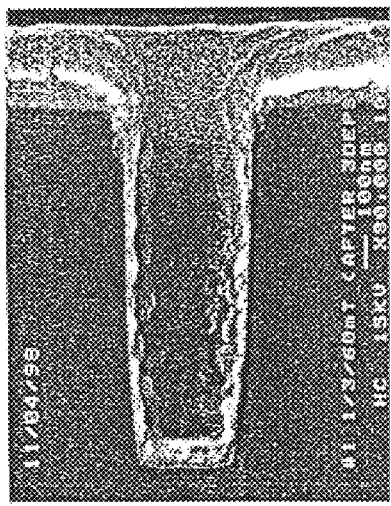

FIGS. 2A and 2B illustrate the difference in morphology of a copper seed layer on a silicon substrate. Near the center of the substrate, the seed layer is smooth and uniform; but near the edge of the substrate the seed layer is rough and non-uniform.

FIG. 2 illustrates a seed layer of copper deposited on the sidewalls of an opening in a silicon substrate in accordance with the method of the prior art. The substrate was clamped to the support and an argon gas was passed to the backside of the substrate so that the gas had a pressure of about 10 torr behind the substrate during deposition of a copper seed layer. The photomicrograph of FIG. 2A was taken at the center of the substrate, and it is apparent that the seed layer is fairly smooth. However, the photomicrograph of FIG. 2B was taken at the edge of the substrate, and it is apparent that the copper seed layer has a rough, uneven surface.

Thus not only is the copper surface rough at the edge of the substrate, the copper layer is non-uniform across the substrate, which cannot be tolerated in present day semiconductor processing.

The copper roughness is not limited to the edge of the substrate, but has been found to be present up to 2.5 inches in from the edge of the substrate, which would adversely affect many devices. This also led us to believe that the surface roughness was not solely because the clamp at the edge of the wafer was hotter than the rest of the surface, since the roughness should then be limited to the area that is beneath the clamp ring.

We have discovered that it is the non-uniformity of backside cooling of the substrate, rather than the presence of the clamp ring, that adversely affects the quality and uniformity of the deposited copper seed layer.

Figure 3A:
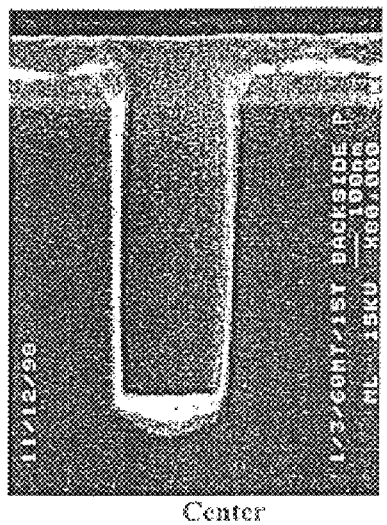
FIGS. 3A and 3B are photomicrographs of a deposited copper seed layer deposited in accordance with the process of the invention.
Figure 3B:
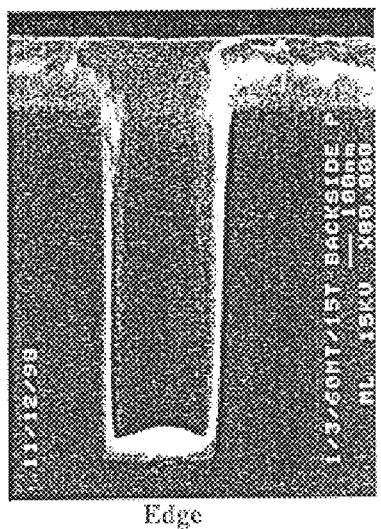

In an effort to improve the uniformity of the temperature of the substrate across its diameter, the pressure of the backside gas was increased to about 15 torr during sputter deposition of copper. The center and edge deposits of copper obtained are shown in FIG. 3. The photomicrograph of FIG. 3A was taken at the center of the substrate, and the photomicrograph of FIG. 3B was taken at the edge of the substrate. It is evident that a much smoother, and more uniform copper layer was obtained across the substrate using a higher backside pressure of the temperature control gas, here resulting in more uniform cooling and in turn to more uniform metal deposition having improved morphology.

Of course there is a limit on the pressure that can be tolerated between the substrate support and the substrate; if too high a pressure is used, the silicon substrate will crack or break, particularly if it has a bowed surface. However, we believe a pressure of at least 15 torr is required to obtain a uniform metal coating across the substrate.

In general, in order to obtain uniform deposited layers, a difference in the pressure of argon gas generated in the substrate support with a substrate clamped to it, and the pressure generated without a clamped substrate, should be about 4 torr for efficient substrate temperature control to be obtained. By increasing the backside pressure to about 15 torr from 10 torr, measured at the center of the substrate, the backside of the substrate support is more uniformly cooled (or heated) and the quality of the deposited film is much improved. This is accomplished by increasing the pressure between the substrate and the support, but without increasing the flow rate of the gas. The pressure gradient from the center to the edge of the substrate is also reduced.

This can be done for example by modifying the placement and number of gas grooves in the surface of the substrate support so as to make the distribution of gas across the substrate support more uniform across the surface. This can be done for any substrate support design, such as flat, curved and the like. In like manner, since the substrate is clamped to the support, any irregularities on the backside of the substrate, or irregularities caused by machining or manufacturing the surface of the substrate support, can be compensated for by the high gas pressure.

The backside gas pressure is higher at the center of the substrate than at the edge, particularly if the wafer has a bowed surface. A flow rate of argon of about 15 sccm is used to obtain a backside pressure of about 15 torr, but higher gas flow rates, up to 45 sccm, can be used.

The backside gas pressure versus gas flow rate can also be modified by the weight of the clamp ring. For example, a clamp ring made of stainless steel will be heavier, and maintain a higher backside pressure for a given gas flow rate than a lighter weight clamp ring, made of titanium for example.

The backside gas then passes into the processing chamber where it can be evacuated together with other gases present in the chamber.

Inert gases can be used for heating or cooling the substrate, such as argon, helium, neon, xenon or nitrogen, as is well known.

After the seed layer is deposited as above, the substrate can be transferred to an electrochemical deposition chamber for deposition of a electrochemically deposited copper layer to the desired thickness.

Although the invention has been described in terms of depositing copper into openings in a silicon wafer, the improved uniformity of backside cooling is generally applicable to other metal or dielectric deposition processes, as well as to etching, of copper and of other materials; in fact to any process that clamps a substrate to a pedestal or support and that needs to be temperature controlled. Further, the present method is useful when the backside gas is used to heat the substrate rather than cool the substrate, by adjustment of the temperature of the temperature control gas.

Thus the invention is only to be limited by the scope of the appended claims.

We claim:

1. A method of depositing a copper seed layer by sputter deposition in a sputter deposition chamber comprising a sputtering target and a substrate support comprising mounting a substrate on the substrate support that is electrically biased and that has a gas inlet passage for a flow of temperature control gas to a top surface of the support, clamping the substrate to the substrate support, passing an inert temperature control gas between the surface of the substrate support and the substrate clamped thereto so that the gas pressure between them is at least 15 torr, and sputter depositing a copper seed layer on the substrate.

2. A method according to claim 1 wherein the temperature control gas is argon.

3. A method according to claim 1 wherein a coil is mounted in the chamber between the substrate support and the sputtering target so as to ionize particles sputtered from the target.

4. A method of improving thickness uniformity and morphology of a sputter deposited copper seed layer across a silicon substrate comprising clamping the silicon substrate to a biased substrate support fitted with a passage for a flow of temperature control gas to the backside of the substrate;

passing a temperature control gas to the backside of the substrate so that the gas pressure is at least 15 torr; and sputtering a copper metal seed layer onto the substrate.

5. A method according to claim 4 wherein the temperature control gas is argon.

* * * * *